United States Patent
Brandenburger

(10) Patent No.: US 6,979,600 B2
(45) Date of Patent: Dec. 27, 2005

(54) APPARATUS AND METHODS FOR AN UNDERFILLED INTEGRATED CIRCUIT PACKAGE

(75) Inventor: Peter D. Brandenburger, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/755,172

(22) Filed: Jan. 6, 2004

(65) Prior Publication Data

US 2005/0145846 A1 Jul. 7, 2005

(51) Int. Cl.[7] .............................................. H01L 21/48
(52) U.S. Cl. .................................................. 438/127
(58) Field of Search ............................. 438/106, 108, 438/122, 124, 126, 127

(56) References Cited

U.S. PATENT DOCUMENTS

| | | | | |
|---|---|---|---|---|
| 5,909,056 A | * | 6/1999 | Mertol | 257/704 |
| 6,074,897 A | * | 6/2000 | Degani et al. | 438/115 |
| 6,083,774 A | | 7/2000 | Shiobara et al. | |
| 6,331,446 B1 | | 12/2001 | Cook et al. | |
| 6,436,737 B1 | * | 8/2002 | Malladi | 438/127 |
| 6,441,480 B1 | | 8/2002 | Takeuchi et al. | |
| 6,756,251 B2 | * | 6/2004 | Lee | 438/108 |
| 6,815,258 B2 | * | 11/2004 | Vincent | 438/118 |

* cited by examiner

*Primary Examiner*—Scott Geyer
(74) *Attorney, Agent, or Firm*—Schwabe, Williamson & Wyatt, P.C.

(57) ABSTRACT

Embodiments of the present invention include first and second substrate structures with underfill injected into a substrate structure interface through a feature of the substrate structure, a heat spreader, and the like.

13 Claims, 3 Drawing Sheets

APPARATUS AND METHODS FOR AN UNDERFILLED INTEGRATED CIRCUIT PACKAGE

FIELD OF THE INVENTION

The present invention relates to the field of integrated circuits, and more particularly, to an integrated circuit package adapted to receive underfill injected at near die-attach temperatures, and a process to make the same.

DETAILED DESCRIPTION

Parts of the description will be presented in terms commonly employed by those skilled in the art to convey the substance of their work to others skilled in the art. For purposes of explanation, specific processes, materials, and configurations are set forth in order to provide a thorough understanding of the illustrated embodiments of the present invention. However, it will be apparent to one skilled in the art that embodiments of the present invention may be practiced without the specific details. In other instances, well-known features are omitted or simplified in order not to obscure the illustrated embodiments of the present invention.

The phrase "in one embodiment" is used repeatedly. The phrase generally does not refer to the same embodiment; however, it may. The terms "comprising," "having," and "including" are synonymous, unless the context dictates otherwise.

Figure 1:
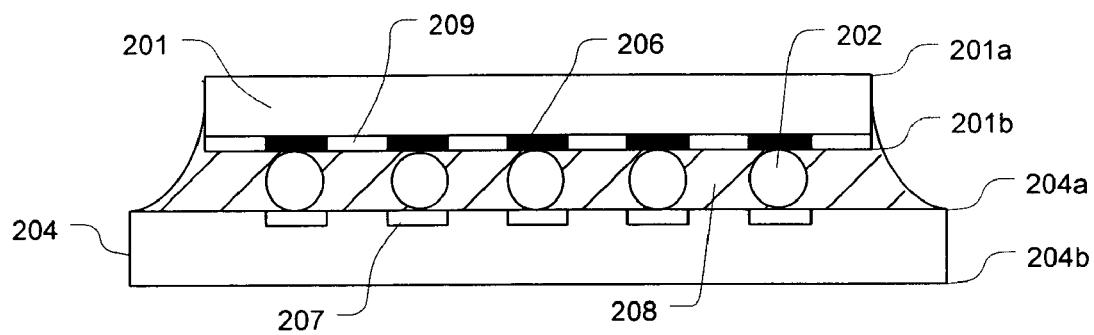
FIG. 1 is a cross-sectional view of an IC package, in accordance with one embodiment of this invention.

FIG. 1 shows an integrated circuit (IC) package 200 in accordance with an embodiment of the present invention. The IC package 200 may include a first substrate structure 201 attached to a second substrate structure 204 with solder bumps 202. The solder bumps are located in between the first and second substrate structures at an area known as the substrate structure interface. A dielectric underfill 208 may be added to the substrate structure interface to substantially surround the solder bumps.

In one embodiment the IC package 200 may include a first substrate structure 201 that comprises a die and a second substrate structure 204 that includes a package substrate. In various embodiments the die 201 may be composed of silicon, silicon on sapphire, silicon germanium, gallium arsenide, or any other suitable materials. An integrated circuit may be fabricated on the die 201 (usually on or near the first die surface 201a) with the terminals of the integrated circuit substantially corresponding with the die pads 206 on the second die surface 201b. A low-k interlayer dielectric (ILD) 209 may be used to insulate adjacent conductive lines in the die 201.

Dies may be fragile with extremely small terminals. Often one or more dies may be placed on a package substrate that provides protection, cooling, and more accessible electrical connections. This may be referred to as a die package. This die package may be attached to an interconnecting substrate that provides integration with components such as high-power resistors, mechanical switches, capacitors, etc., which may not be readily integrated onto a the die package. Examples of interconnecting substrates include, but are not limited to a printed circuit card (PCC) and a printed circuit board (PCB). Referring to FIG. 1, in various embodiments the first substrate structure 201 may represent a naked die, a package substrate, or an interconnecting substrate, while the second substrate structure 204 may represent the package substrate or an interconnecting substrate.

The substrate structures of the IC package 200 are not limited to a particular material. Embodiments which use the substrate primarily for mechanical support and insulating purposes may include ceramic (thick-filmed, cofired, or thin-filmed), plastic, and glass; embodiments using the substrate to provide electrical functions may be composed of a wide variety of semiconductor and ferrite materials. The substrate structures may contain alternating conductive and dielectric layers in order to provide trace paths from one surface to the other. For example, in the embodiment depicted in FIG. 1 where the second substrate structure 204 includes a package substrate, conductive package pads 207 on a first package surface 204a may be electrically connected to a second package surface 204b by these traces.

Solder bumps 202 may be arranged in a two-dimensional array at the substrate structure interface between the second die surface 201b and the first package surface 204a. The solder bumps 202 may comprise a lead-tin solder rich in lead. However, in other embodiments, solder bumps 202 may include various combinations of gold, copper, silver, lead, bismuth, indium, and tin. It may also be desirable for the solder metal to be as compliant as possible, i.e., a low yield strength, so that the solder deforms under relatively low loads without translating the associated stress to the die.

Each of the solder bumps 202 may be substantially aligned between a corresponding die pad 206 and a package pad 207. The solder bumps 202 may be heated to a reflow temperature such that the solder 202 attaches to each of the pads. The reflow temperature may be just above the solidification temperature for a given solder composition.

The package 200 may be allowed to cool to below the solidification temperature of the solder. As the solder solidifies it may form a solder joint that electrically and mechanically interconnects the first substrate structure 201 and the second substrate structure 204. The solder joint in this embodiment may be referred to as a controlled collapse chip connection (C4).

Shortly after the package has cooled to below the solidification temperature of the solder, an underfill material 208 may be injected into the interface. The underfill is usually a type of thermosetting epoxy resin. The underfill may distribute the stress resulting from coefficient of thermal expansion (CTE) mismatches between the IC package components, and thereby reinforcing the C4 solder joints, first substrate structure 201, and the second substrate structure 204. In general, a cured thermosetting material is a cross-linked resin made up of resin, crosslinker, catalyst, fillers, and other components for adhesion and flow. Cross-linking is the attachment of polymer chains by bridges of an element, a molecular group, or a compound, and in thermosets, will occur upon heating. Curing of thermosets may be difficult to reverse because of this structural change of the molecules.

Because the underfill is injected at a high temperature, the thermosetting material may cross-link quickly, inhibiting the flow of the material under the die. Depending on the curing profile of the underfill composition, cross-linking can take place from anywhere between 80 and 170 degrees Celsius (C.). This resistance may be overcome by exerting external pressure by injecting the underfill material. Using external pressure of the injection process may allow the underfill to be quickly dispersed throughout the entire bumped region, before the resin has a chance to gel.

The underfill may be injected until the entire substrate structure interface is substantially filled. Underfill material may also protect the C4 joints from moisture and other forms of contamination, and thus, it may be desirable to underfill beyond the boundaries of the bumped region so that the underfill "wicks up" the side of the die. Depending on the package needs, the amount of underfill injected beyond the bump region could be varied. After the appropriate amount of resin is injected it may be allowed to reach its desired state. Thermosets may be cured by exposing the package to a high temperature until the resin becomes sufficiently cross-linked. In one embodiment this curing could take place in-line by passing the package through a belt oven. Once the underfill 208 is set, it may act as a buffer between the first substrate structure 201 and the second substrate structure 204 and function to distribute the CTE-induced stress over the entire surface, during the cool down and subsequent thermal cycles throughout the chip life.

Figure 2:
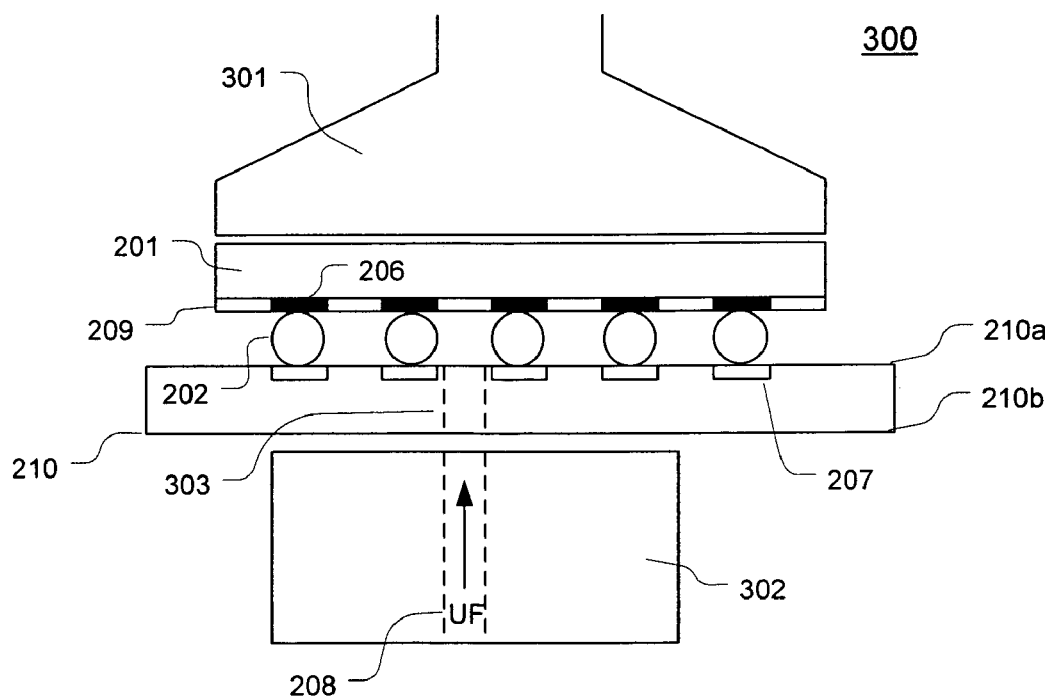
FIG. 2 is a cross-sectional view of an underfill process, in accordance with an embodiment of this invention.

FIG. 2 depicts an underfill process and IC package 300 in accordance with an embodiment of the present invention. In this embodiment the first substrate structure 201 may include a die and the second substrate structure 210 may include a package substrate, similar to the FIG. 1 embodiment. The IC package 300 may be prepared for die attach by cleaning the die pads 206, removing insulating oxides, and providing a pad metallurgy, including an ILD 209, that may protect the integrated circuit while making a good mechanical and electrical connection to the solder bumps 202. Solder bumps 202 may be formed on the first substrate structure 201 so that they are substantially aligned with the die pads 206. Solder bumps 202 may be formed by any number of methods, including, but not limited to, direct placement, electroplating, evaporation, jetting, printing, and stud bumping. The bumped die (201 and 202) may then be placed such that the solder bumps 202 are substantially aligned with the package pads 207. The bumped die may be placed using any number of standard die pick and place mechanisms, e.g., fine-pitch surface-mount technology or high-accuracy flip-chip placement equipment.

In the embodiment depicted by FIG. 2, the first substrate structure 201 may be placed on the second substrate structure 210 by a precision head 301 that heats the first substrate structure 201 to approximately die-attach temperature. Applying heat to the die through the placement mechanism is optional, and may be absent in other embodiments.

Once the solder bumps 202 are substantially aligned with both the die pads 206 and the package pads 207, the solder bumps 202 may be reflowed such that they wet both the pads. The solder may be raised to a reflow temperature by any combination of contact heat from second substrate structure 210, contact heat from the first substrate structure 201, ambient heat provided through a belt furnace, hot gas, or by some other local means. In an embodiment, the second substrate structure 210 may be heated by the injection mechanism 302 or by a substrate support (not shown).

Generally, leaded solders have a lower reflow rate than lead-free solders, e.g., eutectic SnPb is around 183 degrees C., while SnAgCu or SnAg is around 230 degrees C. A lower reflow temperature may at least contribute to a reduction of residual stress from the cool down. However, other considerations, such as subsequent solder packaging, could require solder with higher reflow temperatures.

When the solder reflows, the wetting forces of the solder may pull the bumps 202 and pads (206 and 207) into alignment. After reflowing, the IC package 300 may be allowed to cool below solidification temperature and an electrically and mechanically connective C4 joint may be formed between the first substrate structure 201 and the second substrate structure 210. Shortly following the joint formation, at a temperature slightly below the solidification temperature, an underfill material 208 may be injected into the interface area.

In this embodiment the second substrate structure 210 may have a through hole 303 located approximately at the center of the die shadow. The through hole may have an unobstructed path from the second surface of the second substrate structure 210b to the first surface of the second substrate structure 210a to allow for underfill transmission. In other embodiments, design considerations could place the through hole off-center, or there may be several through holes located under the first substrate structure 201. In this embodiment, underfill 208 may be injected into the substrate structure interface from the second surface of the second substrate structure 210b using the injection mechanism 302.

Figure 3:
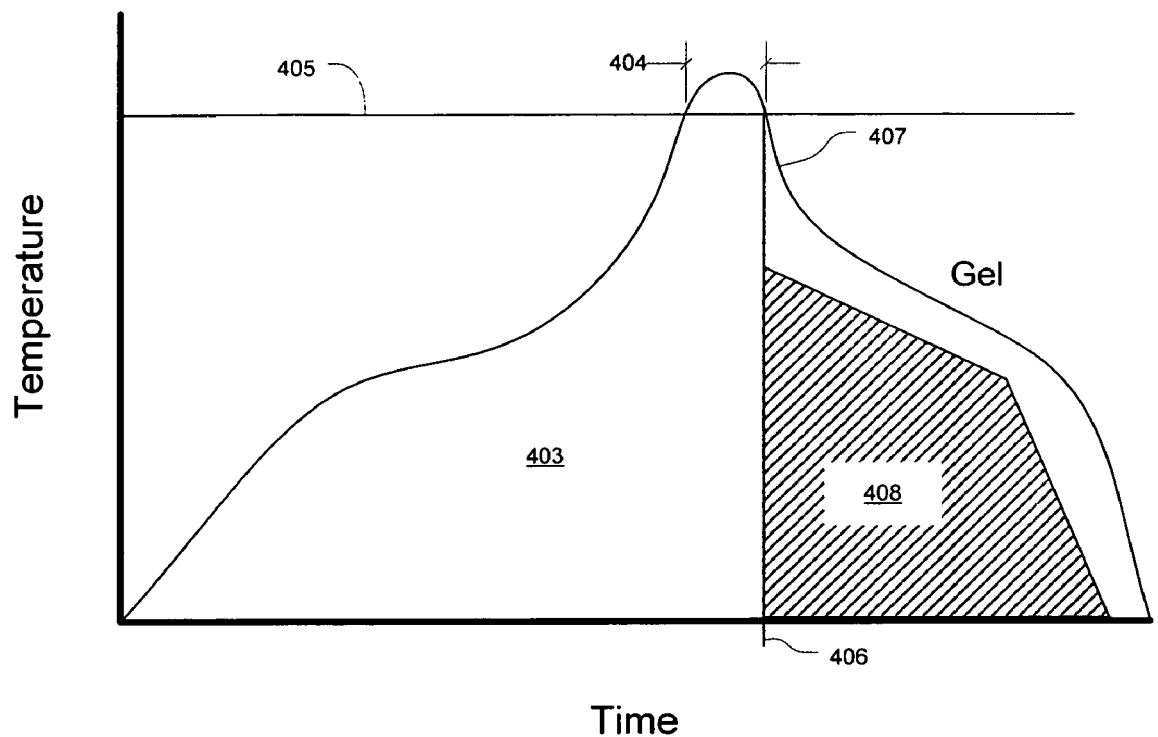
FIG. 3 is a graphical representation of process cycles as a function of time and temperature, in accordance with an embodiment of this invention.

FIG. 3 graphically depicts the underfill timing for one embodiment of this invention as a function of process time and temperature. As the IC package is heated an optional flux may be applied 403 prior to joint formation 404 (hereinafter "joint formation" may also be referred to as "die-attach") to ensure adequate wetting to the surfaces of the substrate structures, if so desired. After the solder has been heated past its melting point 405, the solder bumps may reflow into solder joints 404. Following the die-attach, the IC package is allowed to cool below the solder solidification temperature 406. Shortly after the IC package has dropped below solder solidification 406, underfill may be injected into the interface area 407. While the underfill may be injected prior to solder solidification, it may be advantageous to allow the solder to solidify in order to prevent first substrate structure movement upon the injection of the underfill.

In one embodiment, the underfill may be injected prior to the package cooling down into the component cracking region 408. This practice may at least facilitate the support of the substrate structures and/or joints. The component cracking region 408 may be a temperature, range substantially at or below a component cracking temperature that may result in stress fractures in the ILD (or other parts of the substrate structures) and/or joints, in the absence of any additional support from the underfill. For example, in one embodiment an unsupported ILD may be vulnerable to cracking at temperatures around 180 degrees C. during the cool down; therefore the component cracking range would begin around 180 degrees C., even if the joints and the other substrate structure were not yet at risk at this temperature.

In an embodiment, a triggering mechanism may be used to signal the injection of the underfill before the IC package drops into the component cracking region. This may be done by using temperature sensors, a timer coupled with known component cool down rates, or any other similar methods.

Figure 4:
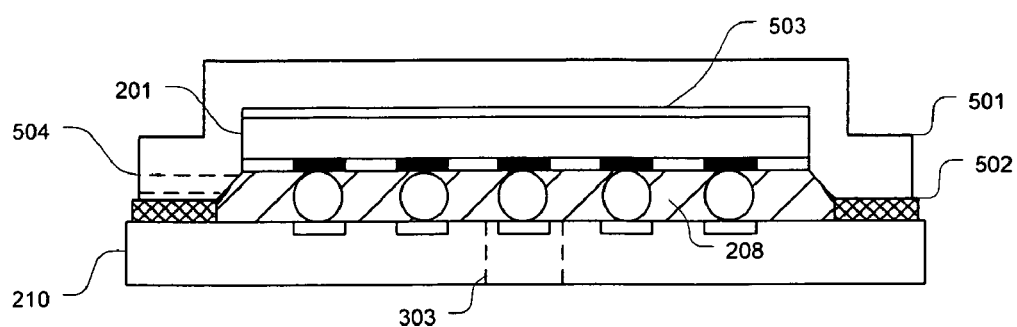
FIG. 4 is a cross-sectional view of an IC package with an integrated heat spreader, in accordance with an embodiment of this invention.

Referring to FIG. 4, an optional integrated heat spreader (IHS) 501 may be placed over the first substrate structure 201 and attached to the second substrate structure 210 in order to dissipate and manage the heat produced during thermal cycles in the operation of the chip. The IHS 501 may be secured to the second substrate structure 210 by a sealant material 502. A thermal interface material (TIM) 503, such as a highly filled epoxy, may be added between the IHS 501 and the first substrate structure 201 to help transfer heat.

The IHS 501 may also serve to define a cavity for the underfill 208 to be injected into, through a hole 303 in the second substrate structure 210. This cavity-defining feature could regulate the amount of underfill 208 to be applied. As discussed earlier, in some applications it may be beneficial to underfill beyond the substrate structure interface. Therefore, specifically tailoring the cavity to coincide with the desired amount and area of underfill 208 may prove beneficial. A cavity may also increase the flow-out rate by allowing a higher pressure injection to be used, without "blowing out" the underfill.

In another embodiment, the underfill 208 could be injected into the cavity through a hole 504 in the IHS 501. In various embodiments, the number and location of holes in the IHS 501 for injecting the underfill could be varied to accommodate design criteria. This embodiment could be employed as the sole point of injection with a standard package substrate (without a hole), or it could be used in conjunction with the second substrate structure 210 for injecting underfill from multiple locations.

Figure 5:
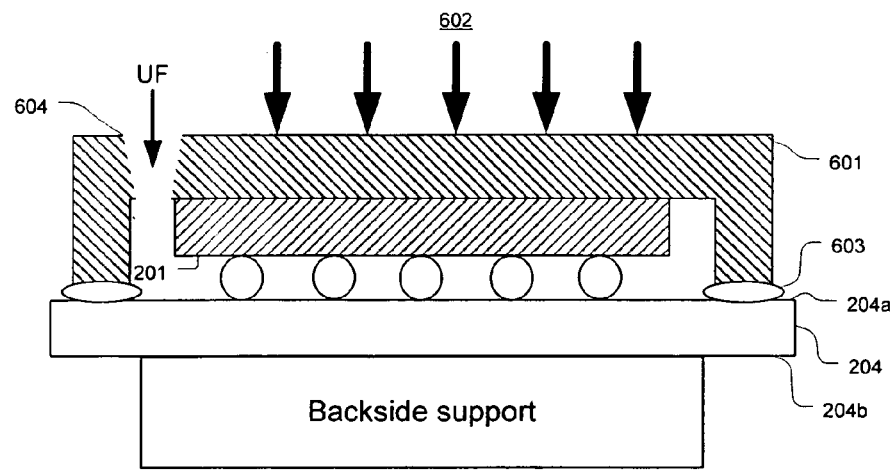
FIG. 5 is a cross-sectional view of an IC package underfill process, in accordance with an embodiment of this invention.

FIG. 5 shows another embodiment of this invention. In this embodiment, a first substrate structure 201 including a die is attached to a second substrate structure 204 including a package substrate, much the same way as discussed above with reference to earlier embodiments. In this embodiment, a chuck 601 may be placed over the first substrate structure 201 such that it provides a seal with the first surface of the second substrate structure 204a. The chuck 601 may be used to define a cavity surrounding the substrate structure interface. The cavity could define the area that the injected underfill 208 will consume. An optional gasket 603 may be located at the contact area between the chuck 601 and the first surface of the package substrate 204a. Optional downward pressure 602 from the chuck 601 may be applied to the topside of the first substrate structure 201. This pressure 602 may be utilized in various embodiments such as, but not limited to embodiments using thermocompression bonding techniques. It could also be advantageous in embodiments where the underfill injection takes place prior to solder joints annealing and forming a mechanical connection between the first substrate structure 201 and the second substrate structure 204. In those embodiments the downward pressure could help stabilize the first substrate structure 201 during the injection. The chuck 601 may also be used to heat and place the first substrate structure 201. After the package has cooled slightly from the die-attach temperatures, underfill 208 may be injected through a hole 604 in the chuck 601. In different embodiments, the position and number of the holes through which the underfill is injected may be varied depending on the specific needs of the manufacturing process.

Embodiments of this invention may not only be beneficial by providing early support for the solder joints and package interface, but it may also present the possibility of using more diverse and potentially beneficial types and compositions of underfill.

The CTE of the underfill material may at least in part compensate for a CTE mismatch between the die and the package substrate. In order to reduce the solder joint fatigue and to reinforce the ILD layer, the CTE of the underfill material may be in the range of about 20–40 ppm/deg C. Raw epoxy resin, which may be used as the base material for the underfill, has a CTE of approximately 70 ppm/deg C. This may be too high for many underfill applications where typical CTEs for silicon, solder, and substrates are between 4 ppm/deg C. and 21 ppm/deg C. In order to lower the CTE, filler particles like silica, for example, may be added. However, as filler particles are added the viscosity of the underfill rises, which may make it more difficult to flow out. With the injection force used in embodiments of this invention potentially being more substantial than the capillary force, it may be possible to work with higher viscosity/lower CTE underfill materials.

In an embodiment, a thermoplastic resin may be used as the underfill material. As discussed earlier, the curing of a thermosetting resin involves a cross-linking of polymer chains. Once this structural change occurs, it may be difficult to reverse. However, often testing of the packaged part results in the need for reworking the component parts, which may be difficult with thermosetting material. Contrary to thermosets, when thermoplastics are heated and injected into interface, there is no structural change of the molecules. So even after the plastic has cooled and hardened into shape, it may be subsequently reheated and reworked as necessary. Thermoplastics are also known as "reworkable underfills."

Figure 6:
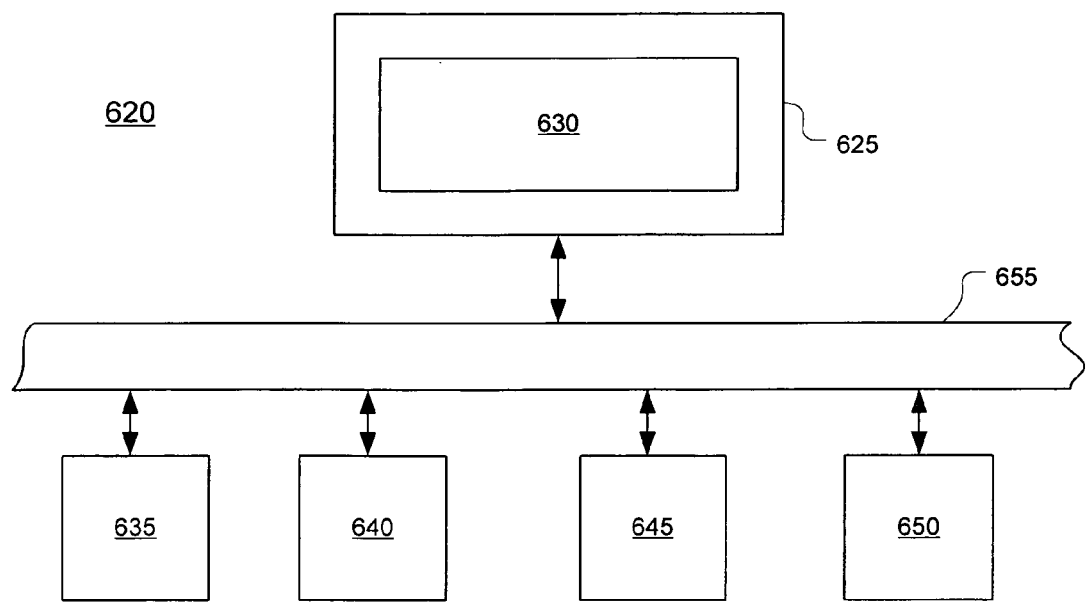
FIG. 6 is a block diagram of a system including an IC package, in accordance with one embodiment of this invention.

Referring to FIG. 6, there is illustrated one of many possible systems in which embodiments of the present invention may be used. The IC package 625 may be similar to the IC packages depicted in above FIGS. 1, 2, 4, and 5. In one embodiment, the IC package 625 may include a microprocessor 630. In an alternate embodiment, the IC package 625 may include an application specific IC (ASIC). Integrated circuits found in chipsets, e.g., graphics (similar to the graphics processor 635), sound and control chipsets, may also be packaged in accordance with embodiments of this invention.

For the embodiment depicted by FIG. 6, the system 620 also includes a main memory 640, a graphics processor 635, a mass storage device 645, and an input/output module 650 coupled to each other by way of a bus 655, as shown. Examples of the memory 640 include but are not limited to static random access memory (SRAM) and dynamic random access memory (DRAM). Examples of the mass storage device 645 include but are not limited to a hard disk drive, a compact disk drive (CD), a digital versatile disk drive (DVD), and so forth. Examples of the input/output modules 650 include but are not limited to a keyboard, cursor control devices, a display, a network interface, and so forth. Examples of the bus 655 include but are not limited to a peripheral control interface (PCI) bus, and Industry Standard Architecture (ISA) bus, and so forth. In various embodiments, system 620 may be a wireless mobile phone, a personal digital assistant, a pocket PC, a tablet PC, a notebook PC, a desktop computer, a set-top box, an audio/video controller, a DVD player, and a server.

Conclusion and Epilogue

Thus, it can be seen from the above descriptions, a novel underfilled IC package has been described.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the above embodiments without departing from the scope of the present invention. Those with skill in the art will readily appreciate that the present invention may be implemented in a wide variety of embodiments. This application is intended to cover any adaptations or variations of the embodiments discussed herein. Therefore, it is manifestly intended that this invention be limited only by the claims and the equivalents thereof.

What is claimed is:

1. A method comprising:

forming an electrical interconnection between a first and second substrate structure by heating a solderable material, located substantially in a first portion of a substrate structure interface, to a reflow temperature; and injecting underfill material into a second portion of the substrate structure interface, before at least a selected one of the first and second substrate structure cools substantially below the reflow temperature.

2. The method of claim 1, wherein the injecting underfill material is done when at least a selected one of the first and second substrate structure is approximately between a solder solidification temperature and a component cracking temperature.

3. The method of claim 2, wherein the solder solidification temperature is a temperature selected from a range that is approximately between 180 degrees Celsius (C.) and 230 degrees C. and the component cracking temperature is approximately 180 degrees C.

4. The method of claim 1, wherein injecting underfill material into a second portion of the substrate structure interface comprises injecting underfill material through at least one hole in the second substrate structure.

5. The method of claim 4, wherein the at least one hole in the second substrate structure is located approximately under the center of the first substrate structure.

6. The method of claim 1, further comprising:

placing a heat spreader over the first substrate structure and attaching the heat spreader to the second substrate structure, the heat spreader to form a substantially sealed cavity surrounding the substrate structure interface; and injecting underfill material until sealed cavity is substantially filled.

7. The method of claim 6, wherein injecting underfill material comprises injecting underfill material through at least one hole in the second substrate structure.

8. The method of claim 6, wherein injecting underfill material comprises injecting underfill material through at least one hole in the heat spreader.

9. The method of claim 1, further comprising:

temporarily placing a chuck over the first substrate structure to form a substantially sealed cavity surrounding the substrate structure interface; and injecting underfill material, through at least one hole in the chuck, until the sealed cavity is substantially filled.

10. The method of claim 9, wherein the chuck heats the first substrate structure.

11. A method comprising:

forming an electrical interconnection between a first and second substrate structure by heating a solderable material, located substantially in a first portion of a substrate structure interface, to a reflow temperature; and injecting an underfill material into a second portion of the substrate structure interface during an early portion of a cool-down phase immediately following said forming of the electrical interconnection.

12. The method of claim 11, wherein said injecting of an underfill is based at least in part on a condition of the solderable material and a temperature of at least a selected one of the first and second substrate structures.

13. The method of claim 12, wherein the condition of the solderable material is at least substantially solidified and the temperature of at least the selected one of the first and second substrate structures is approximately greater than a component cracking temperature.

* * * * *